United States Patent [19]

Urushibata

[11] 4,375,084
[45] Feb. 22, 1983

[54] DIGITAL INPUT APPARATUS

[75] Inventor: Yukio Urushibata, Hino, Japan

[73] Assignee: Tokyo Shibaura Denki Kabushiki Kaisha, Kawasaki, Japan

[21] Appl. No.: 196,049

[22] PCT Filed: Jun. 29, 1979

[86] PCT No.: PCT/JP79/00169

§ 371 Date: Apr. 28, 1980

§ 102(e) Date: Apr. 21, 1980

[30] Foreign Application Priority Data

| Aug. 28, 1978 [JP] | Japan | 53-103806 |
| Aug. 28, 1978 [JP] | Japan | 53-103807 |
| Aug. 28, 1978 [JP] | Japan | 53-103808 |

[51] Int. Cl.³ .............. G06F 11/00; G06M 3/02
[52] U.S. Cl. ........................................ 364/900; 377/55
[58] Field of Search ......... 235/92 DE, 92 ST, 92 FP, 235/92 EV, 92 MT; 364/900 MS File, 200 MS File; 328/41, 44, 48, 50, 104, 154; 307/238.6

[56] References Cited

U.S. PATENT DOCUMENTS

| 3,331,060 | 7/1967 | Willis | 364/900 |
| 3,891,971 | 6/1975 | Hirvela et al. | 364/900 |
| 4,106,091 | 8/1978 | Hepworth | 364/200 |

FOREIGN PATENT DOCUMENTS

| 40-23140 | 10/1965 | Japan . |
| 50-55225 | 5/1975 | Japan . |
| 52-24436 | 2/1977 | Japan . |

Primary Examiner—Harvey E. Springborn
Attorney, Agent, or Firm—Kenyon and Kenyon

[57] ABSTRACT

A digital input apparatus is provided which is used as an input apparatus for a digital signal processor and can eliminate noise components resulting from electromagnetic induction and resulting from chattering which is produced by the opening or closing of a contact. One input signal outputted from the multiplexer (105) is applied through a latch flip-flop (108) to a counter (114) used on a time sharing basis so that counting is effected. Individual counts corresponding to a plurality of input signals are stored in a memory (117). When a count becomes all "1's" or "0's", the counter (114) produces a carry signal or a borrow signal supplied to a J-K flip-flop (113). The J-K flip-flop (113) produces an input signal of a predetermined waveform free from noise components.

11 Claims, 36 Drawing Figures

F I G. 5
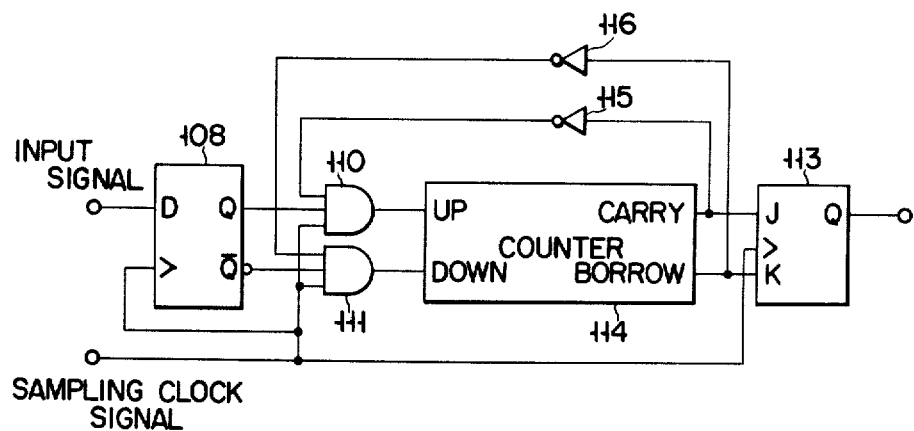
F I G. 8
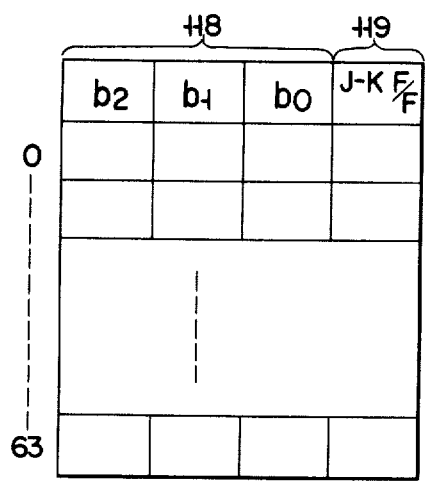

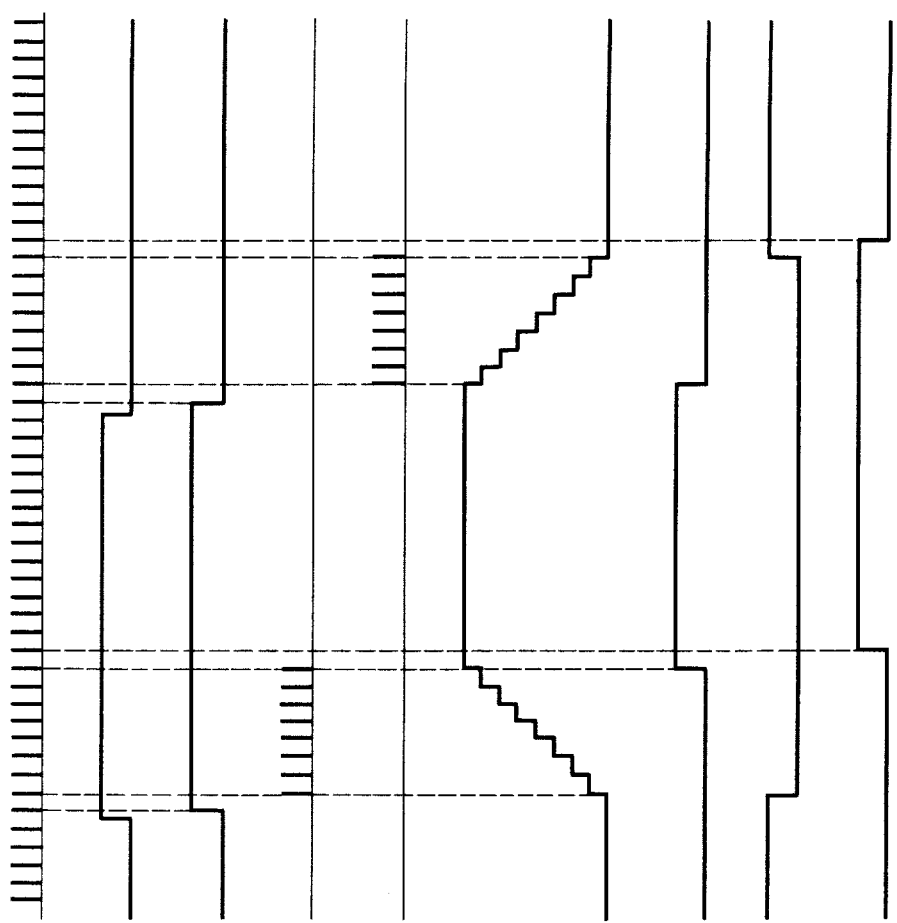

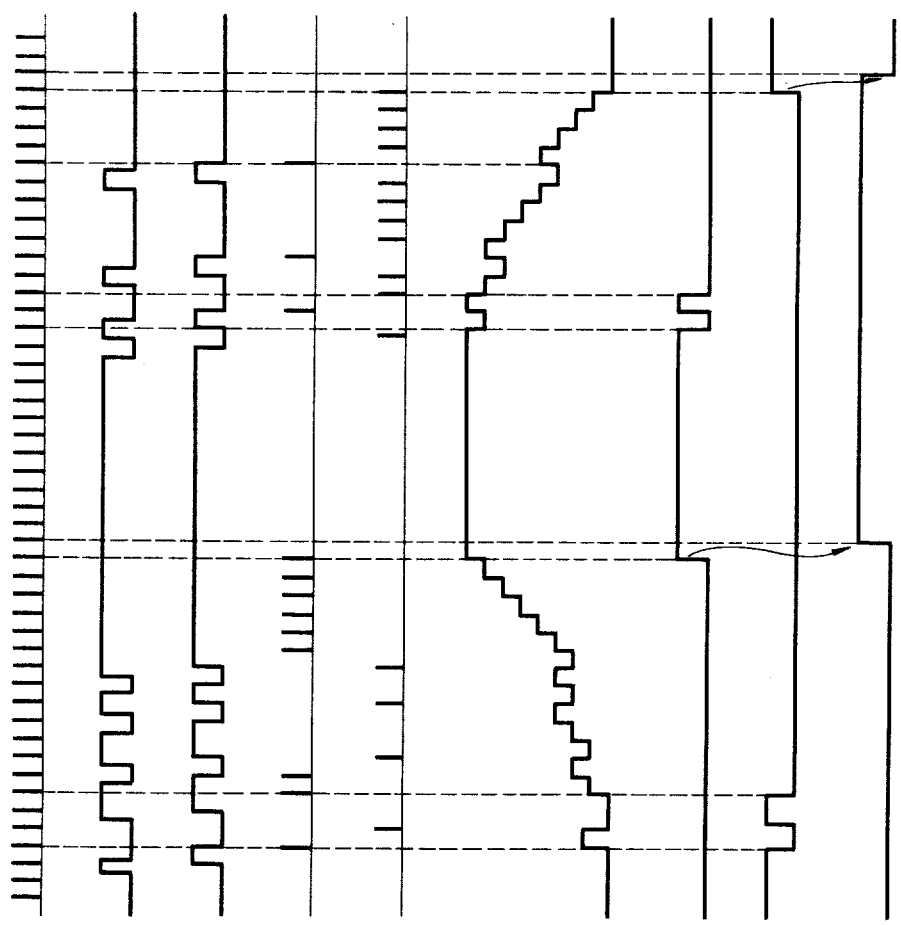

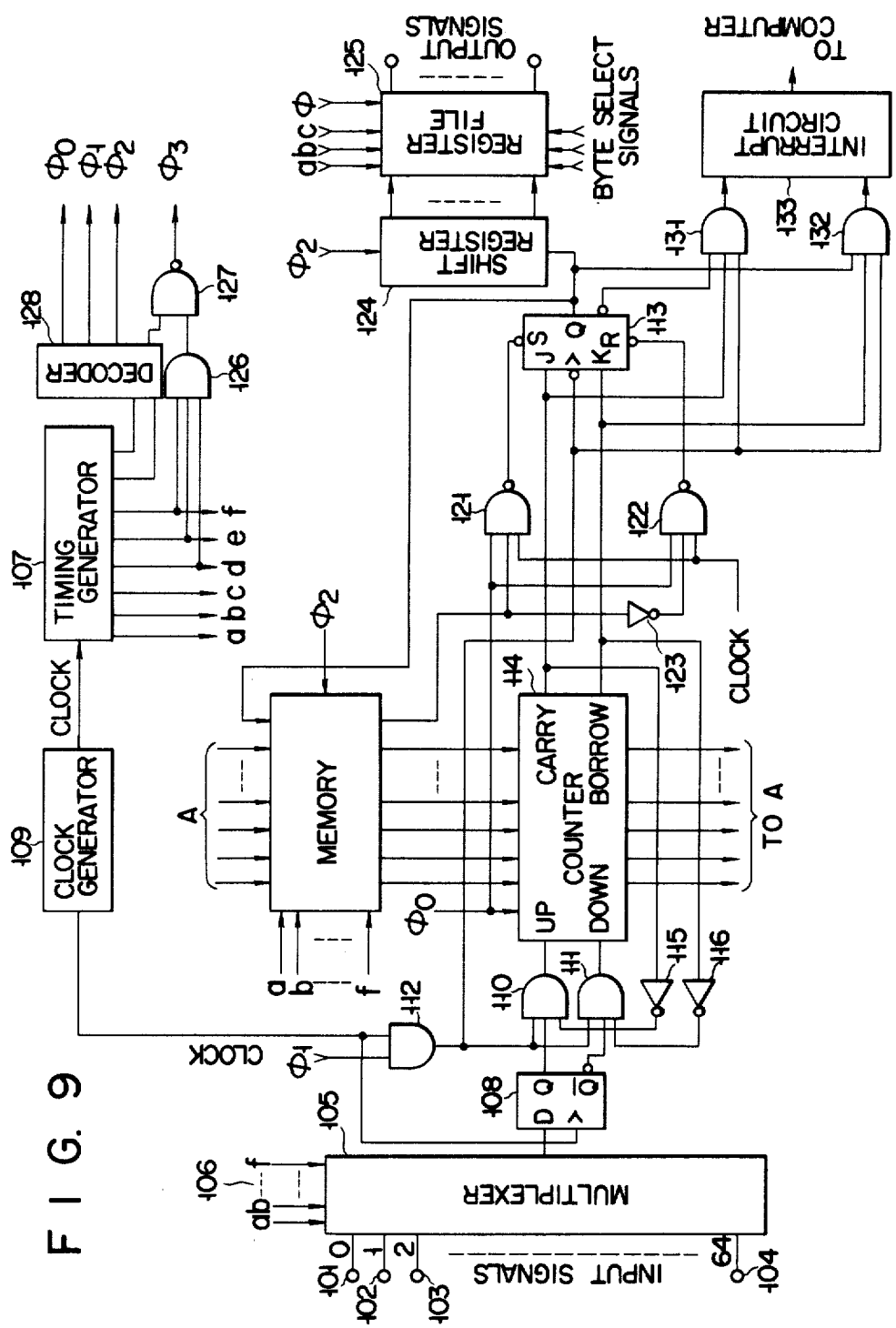
F I G. 9

DIGITAL INPUT APPARATUS

FIELD OF THE INVENTION

This invention relates to a digital input apparatus and in particular to a digital input apparatus which can eliminate chattering caused by the opening or closing of a contact and noise components caused by electromagnetic induction.

BACKGROUND OF THE PRIOR ART

FIG. 1 shows a conventional digital input apparatus.

A plurality of input signals 11, 12, 13, 14 and 15 are supplied through a multiplexer 16 to a signal processing apparatus such as a computer and in order to prevent chattering, a filter circuit 21 comprising resistors 17, 18, capacitor 19 and inverter 20 is used in the conventional apparatus. Since in the CR filter including the capacitor 19 and resistors 17, 18 there is a variation in the values of the elements, a variation in delay time occurs. In order to correct such a variation, a more complicated correction circuit is necessary, leading to an increase in discrete parts. As a filter circuit is required for each input signal, if the number of input signals is increased, the number of discrete parts is increased, leading to a complicated circuit, difficulty in assembly and a rise in cost.

FIG. 2 shows a digital input apparatus having a status variation detection function as in the prior art. In FIG. 2, respective input signals 22, 23, 24, 25 are supplied respectively through filter circuits 26 to a multiplexer 27 and corresponding status detection circuits 28. The status detection circuits 28 are each constructed of a differential circuit. The output signals of the status detection circuits 28 are supplied to an OR circuit 29. The output signal of the OR circuit 29 is supplied to an interrupt circuit 30. When an input signal varies in the digital input apparatus, one or a plurality of detection pulses are produced from the status detection circuit 28. The detection pulse is supplied through the OR circuit 29 to the interrupt circuit 30. The interrupt circuit 30 interrupts a computer which in turn receives an output signal which is outputted by an interrupt operation from the multiplexer 27.

Since in such a conventional system a the filter circuit 26 and status detection circuit 28 are required for each input signal the number of discrete parts is increased in proportion to an increase in the number of input signals, resulting in a lower packing density and in an expensive digital input apparatus.

It is accordingly an object of this invention to provide a high-reliability digital input apparatus free from the above-mentioned drawbacks, in which even if noise resulting from chattering etc. is superposed onto an input signal, the input signal is digitally processed to permit the delay time of the input signal to be equalized.

SUMMARY OF THE INVENTION

This invention provides a digital input apparatus which requires fewer component parts, in which a flip-flop and counter are provided so as to obtain a filter effect, and a delay time can be easily and accurately set by varying the cycle of clock signals and bit length of the counter.

The counter is used on a time sharing basis and even if the number of input signals is increased the number of component parts is not correspondingly increased. Further, an improvement in manufacturability as well as in packing density can be attained without using discrete parts.

BRIEF DESCRIPTION OF THE DRAWINGS

FIG. 4A shows a pulse waveform of an address signal a;

FIG. 4B shows a pulse waveform of an address signal b;

FIG. 4C shows a pulse waveform of an address signal c;

FIG. 4D shows a pulse waveform of an address signal d;

FIG. 4E shows a pulse waveform of an address signal e;

FIG. 4F shows a pulse waveform of an address signal f;

FIG. 5 is a block diagram of a a digital input apparatus for a single input signal according to an embodiment of this invention;

FIGS. 6A–6I and 7A–7I show waveforms of signals associated with the digital input apparatus of FIG. 5;

FIG. 6A shows a signal waveform of a sampling clock;

FIG. 6B shows a waveform of an input signal when no noise is superposed thereon;

FIG. 6C shows a waveform of the input signal of FIG. 6B which is latched by a D-type flip-flop;

FIG. 6D shows a waveform of a count-up pulse inputted to the UP terminal of an up-down counter;

FIG. 6E shows the waveform of a count-down pulse applied to a DOWN terminal of the up-down counter;

FIG. 6F shows a waveform showing the count values of the up-down counter;

FIG. 6G shows a waveform of a CARRY signal outputted from the up-down counter;

FIG. 6H shows a waveform of a BORROW signal outputted from the up-down counter;

FIG. 6I shows a waveform outputted from a J-K flip-flop;

FIG. 7A shows a waveform of sampling clocks;

FIG. 7B shows a waveform of an input signal on which noise is superposed;

FIG. 7C shows a waveform of an input signal latched by a D-type flip-flop;

FIG. 7D shows a waveform of a count-up pulse inputted to the UP terminal of the up-down counter;

FIG. 7E shows a count-down pulse inputted to the DOWN terminal of the up-down counter;

FIG. 7F shows a waveform showing the count values of the up-down counter;

FIG. 7G shows a waveform of a CARRY signal outputted from the up-down counter;

FIG. 7H shows a waveform of a BORROW signal outputted from the up-down counter;

FIG. 7I shows a waveform of an output signal outputted from the J-K flip-flop;

FIG. 8 is a diagram showing the contents stored in the memory of the digital input apparatus of FIGS. 3 and 9; and FIG. 9 is a block diagram showing a multiplexed digital input apparatus according to another embodiment of this invention.

DETAILED DESCRIPTION OF THE INVENTION

Figure 3:
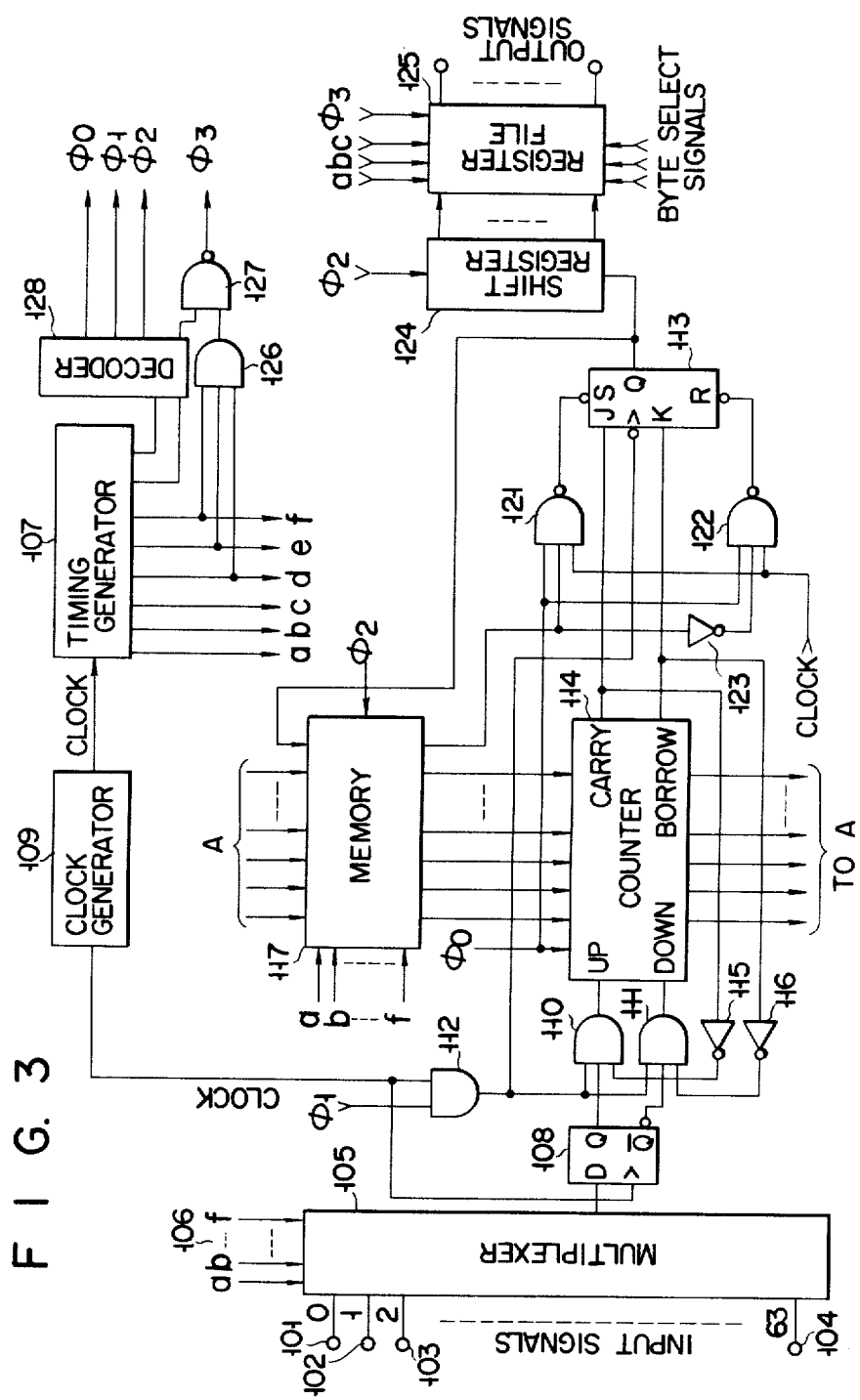
FIG. 3 is a block diagram showing a multiplexed digital input apparatus according to an embodiment of this invention.
Figures 4A, 4B, 4C, 4D, 4E, 4F, 4G, 4H, 4I, 4J, 4K, 4L:
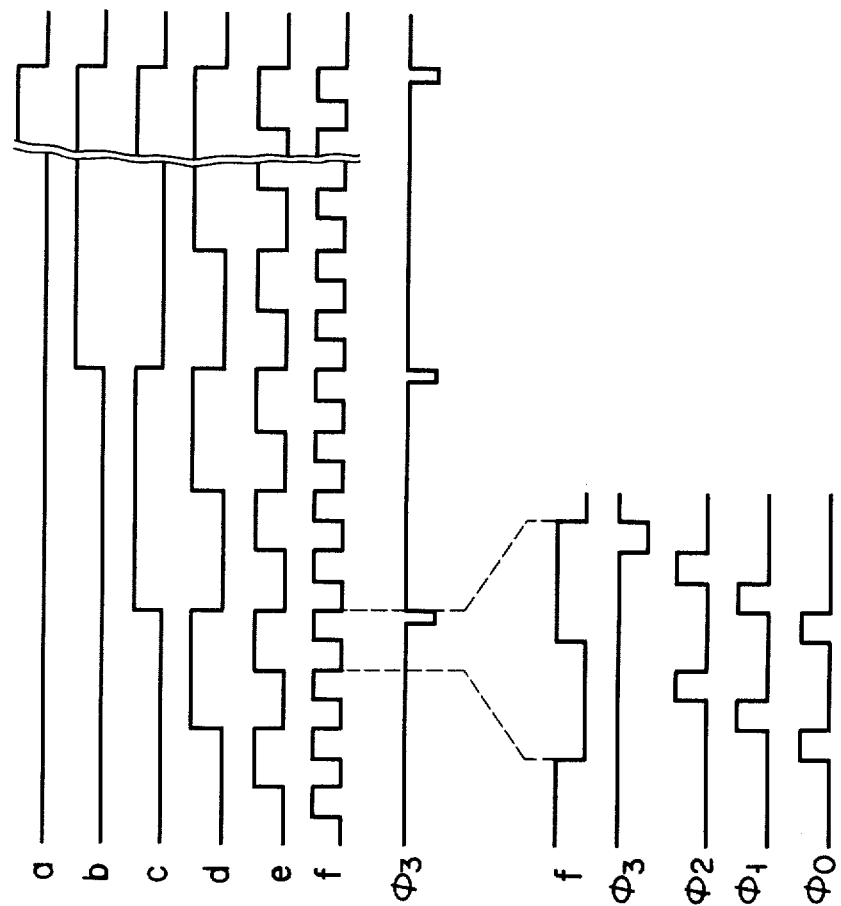
FIGS. 4A–4F show pulse waveforms of address signals from a timing generator and timing signals from a decoder of the digital input apparatus of FIGS. 3 and 9, as indicated below.
FIG. 4G shows a pulse waveform of a timing signal $\phi_3$.
FIG. 4H shows an enlarged waveform of the waveform of FIG. 4F.
FIG. 4I shows a pulse waveform of a timing signal $\phi_3$.
FIG. 4J shows a pulse waveform of a timing signal $\phi_2$.
FIG. 4K shows a pulse waveform of a timing signal $\phi_1$.
FIG. 4L shows a pulse waveform of a timing signal $\phi_0$.

In FIG. 3, input signals 101, 102, 103, 104 (64 in this embodiment) are inputted to a multiplexer 105. In response to a control signal 106 (a, b, c, d, e, f) supplied from a timing generator 107 to be described later to the multiplexer 105, a selected one of the 64 input signals is outputted from the multiplexer 105. The output terminal of the multiplexer 105 is connected to the D input terminal of a D-type flip-flop 108. A clock signal from a clock generator 109 is supplied to the clock input terminal of the D-type flip-flop 108.

The D-type flip-flop 108 latches the output signal outputted from the multiplexer 105. The set output terminal Q of the D-type flip-flop 108 is connected to one input terminal of a first 3-input AND circuit 110 and the inverting output terminal $\overline{Q}$ of the D-type flip-flop 108 is connected to one input terminal of a second 3-input AND circuit 111. A second input terminal of the first and second 3-input AND circuits 110 and 111 is connected to the output terminal of an AND circuit 112. A clock signal from the clock generator 109 and timing a signal $\phi_1$ from a timing generator 107 are supplied to the input terminal of the AND circuit 112. The first 3-input AND circuit 110 produces a count-up pulse in synchronism with the clock signal when the output of the D-type flip-flop 108 and a carry signal to be described later are "1" and "0" respectively. The second 3-input AND circuit 111 produces a count-down pulse in synchronism with the clock signal when the inverting output of the D-type flip-flop 108 and a borrow signal to be described later are "1" and "0", respectively.

The AND circuit 112 supplies input signals to the first and second 3-input AND circuits 110 and 111 and supplies a trigger input signal a J-K flip-flop 113 as will be described later. The output terminal of the first 3-input AND circuit 110 is connected to the UP input terminal of a binary up-down counter 114 and the output terminal of the second 3-input AND circuit 111 is connected to the DOWN input terminal of the counter 114. The CARRY output terminal and the BORROW output terminal of the binary up-down counter 114 are connected to the J input terminal and K input terminal, respectively, of the J-K flip-flop 113 and respectively through inverters 115 and 116 to the remaining input terminals of the first and second 3-input AND circuits 110 and 111. The up-down counter 114 will be described for a three-bit configuration for convenience. The binary up-down counter 114 is incremented bit by bit by the count-up pulse from the first 3-input AND circuit 110 and decremented bit by bit by the count-down pulse from the second 3-input AND circuit 111. When the count content of the counter becomes all "1's" (111 in this embodiment), the counter produces a carry signal. When the count of the counter becomes all "0's" (000 in this embodiment), the counter produces a borrow signal.

The counter 114 is connected to a memory 117 so that data transfer is effected between the counter 114 and the memory 117.

The memory 117 comprises an area 118 (FIG. 8) (3 bits in this embodiment) for storing a count of the up-down counter 114 upon receipt of one of the 64 input signals and an area 119 (1 bit in this embodiment) for storing the contents of the J-K flip-flop 113.

A timing signal $\phi_0$ is supplied from the timing generator 107/decoder 128 to the counter 114 and a timing signal $\phi_2$ is supplied from the timing generator 107/decoder 128 to the memory 117.

The output terminal of a first 3-input NAND circuit 121 is connected to the set input terminal S of the J-K flip-flop 113 and the output terminal of a second 3-input NAND circuit 122 is connected to the reset input terminal R of the J-K flip-flop 113.

The J-K flip-flop 113 is set when said carry signal is "1" and reset when said borrow signal is "1". The flip-flop 113 holds the previous state when the carry and borrow signals are "0's".

The first and second 3-input NAND circuits 121 and 122 are circuits for setting and resetting the above-mentioned J-K flip-flop 113.

The timing signal $\phi_0$ from the timing generator 107 and the clock signal from the clock generator 109 are supplied to a second input of the first and second 3-input NAND circuits 121 and 122, respectively. The remaining input terminal of the first 3-input NAND circuit 121 is connected to the memory 117 and the remaining input terminal of the second 3-input NAND circuit 122 is connected through an inverter 123 to the memory 117.

The output terminal Q of the J-K flip-flop 113 is connected to a shift register 124 and the memory 117.

The timing signal $\phi_2$ from the timing generator 107/decoder 128 is supplied to the shift register 124. The output terminal of the shift register 124 is connected to the input terminal of a register file 125. The shift register 124 converts serial data from the J-K flip-flop 113 to 8-bit parallel data. Control signals a, b, c, as well as a timing signal $\phi_3$, are applied to the register file 125. A byte select signal is applied to the register file 125 and a predetermined number of bytes are outputted by the byte register file in response to the select signal, for example, to a computer.

The register file 125 stores an input signal free from noise from the shift register and has an 8-bit × 8-word configuration to interface with a computer as a signal processor.

The above-mentioned timing generator 107 is connected to the clock generator 109 and supplied with a clock signal from the clock generator 109 to deliver the address control signals a to f. The control signals d, e, f are inputted to a 3-input AND circuit 126 and the output of the 3-input AND circuit 126 is supplied to one input of a NAND circuit 127 and an output signal from the decoder 128 is supplied to the other input of the NAND circuit 127. The NAND circuit 127 delivers the timing signal $\phi_3$. A reference clock signal is supplied to the timing generator 107. The decoder 128 decodes an output from the timing generator 107 to produce signals $\phi_0$, $\phi_1$, $\phi_2$. The timing generator 107 produces an address control signal (formed by a combination of a, b, c, d, e, f) for selecting one of 64 input signals which are inputted to the multiplexer 105.

The address is used as an address for reading out predetermined data from the memory 117 and also to designate registers in the register file 125.

One embodiment of this invention is constructed as shown in FIG. 3 and described above and the operation thereof is described below.

The timing generator 107 produces address signals a, b, c, d, e, f as shown in FIGS. 4A to 4F. The address signal a, b, c, d, e, f from the timing generator 107 is supplied to the multiplexer 105 to designate one of the 64 input signals applied to the multiplexer 105. If, for example, the address signal a, b, c, d, e, f is (0, 0, 0, 0, 0, 0), an input signal 0 is selected. If the address signal is (0, 0, 0, 0, 0, 1), an input signal 1 is selected.

The address signal a, b, c, d, e, f becomes an address signal of the memory 117 and designates the location of the memory 117 which corresponds to the 64 input signals. While the signal a, b, c, d, e, f is being held constant, four timing signals $\phi_0$, $\phi_1$, $\phi_2$, $\phi_3$ are produced as shown in FIGS. 4L, 4K, 4J, 4I.

When the timing signal $\phi_0$ is produced, the contents of the memory 117 designated by, for example, the address signal (0, 0, 0, 0, 0, 1) are preset to the counter 114 and J-K flip-flop 113.

That is, a value to be incremented or decremented by the counter 114 is set (in this case, there will occur the case where in the initial state the contents of the memory 117 are zeros and initially cleared). At the same time, an input signal selected at the multiplexer 105 is latched to the D-type flip-flop 108.

Upon generation of the timing signal $\phi_1$, the timing signal $\phi_1$ and clock signal are supplied to the AND circuit 112. The AND circuit 112 delivers a logical "1" signal. Suppose that the logical "1" signal is applied to one input of the 3-input AND circuits 110, 111, then the set output signal Q of the D-type flip-flop 108 is a logical "1", and that the preset values of the counter 114 are not all logical "1"s. Since in this case the carry signal of the counter 114 is a logical "0", a logical "1" signal is applied to the first 3-input AND circuit 110 through an inverter 115. In consequence, the first AND circuit 110 delivers a logical "1" count-up pulse. The count-up pulse signal is inputted to the UP terminal of the counter 114 and the counter 114 is incremented by one.

Now suppose that the reset output $\overline{Q}$ of the D-type flip-flop 108 is a logical "1" and that the preset values of the counter 114 are not all logical "0". Since in this case the borrow signal of the counter 114 is a logical "0", a logical "1" signal is applied through the inverter 116 to the second 3-input AND circuit 111. In consequence, the second AND circuit 111 delivers a logical "1" count-down pulse and the count-down pulse signal is supplied to the DOWN terminal of the counter 114 to cause the counter 114 to be decremented by one.

Upon generation of the timing signal $\phi_1$, the J-K flip-flop 113 is set if the carry signal of the counter 114 is a logical "1", reset if the borrow signal is a logical "1", and holds a value preset from the memory 117 upon generation of the timing signal $\phi_0$, if both carry and borrow signals are a logical "0".

The contents of the counter 114 and contents of the J-K flip-flop 113 are stored by the timing signal $\phi_2$ in the location of the memory 117 which is designated by the above-mentioned address signal a, b, c, d, e, f and at the same time the content of the J-K flip-flop 113 is shifted one bit to the shift register 124.

As shown in FIGS. 4A to 4F, the address signal (for example, 000001) is next produced. As a result, processing is effected with respect to an input signal #1, as above mentioned, based on the timings $\phi_0$ to $\phi_1$.

When the operation effected during the timings $\phi_0$ to $\phi_2$ is repeated eight times i.e. an eight bit input signal is processed, eight output signals are latched to the shift register 124 and at this time the timing signal $\phi_3$ is produced.

Upon generation of the timing signal $\phi_3$, 8-bit data from the shift register 124 is latched to one register in the register file 125 which is designated by the address signal a, b, c. The number of bytes designated by the byte select signal is delivered on a byte by byte basis to the output of the register file 125.

It is to be noted in this case that the eight signals supplied to one register in the register file are assumed to be different from each other and in consequence noise superposed on the individual input signals are of course of different magnitudes. Therefore, the number of times the counter effects counting until a carry signal or a borrow signal is produced is different for each input signal. That is, where there is an input signal of much less noise, if an initial value is preset to a certain value, for example, "110", a carry signal will be produced when a count-up pulse is applied just once to the counter 114.

Since the write-in to the memory 117 is effected such that the count of the counter is stored in the memory 117 each time the counter 114 is incremented or decremented once, a complete output signal is obtained with respect to the individual input signals after an input signal is supplied eight times at most with respect to the 64 input signals. If therefore output signals previously delivered to the register file 125 based on the timing $\phi_3$ are not desired, a program can be assembled such that these output signals are ignored at the computer side.

When the above-mentioned operation is viewed from another angle, the counter acts as a filter and is operated on a time sharing basis with respect to the 64 input signals.

Now suppose that the counter 114 is operated for one input signal without using a time sharing scheme. In this case, the input circuit is configured as shown in FIG. 5 and the waveform of each section of the circuit is as shown in FIGS. 6 and 7.

In the following description, no noise resulting from chattering etc. is superposed onto the input signal.

When the input signal varies from a logical "0" to a logical "1", a logical "1" input signal as shown in FIG. 6B is latched by the D-type flip-flop 108 in synchronism with a sampling clock signal (a logical product output of the timing signal $\phi_1$ and the clock signal) as shown in FIG. 6A and a waveform of an input signal as shown in FIG. 6C is obtained. The set output of the D-type flip-flop 108 is inputted to the UP terminal of the counter 114 through the first AND gate 110. As a result, the counter starts a counting operation and is incremented bit by bit as shown in FIG. 6F. When the count of the counter 114 becomes all "1"s, i.e. a value "111", a carry signal is generated as shown in FIG. 6G. When the carry signal is sent from the counter 114 to the J input of the J-K flip-flop 113, the flip-flop is set and the Q output of the flip-flop 113 becomes "1" as shown in FIG. 6I. At the same time the first 3-input AND circuit 110 is disabled because the carry signal is inverted through the inverter 115. As a result, since as shown in FIG. 6D no count-up pulse is supplied to the UP terminal of the counter 114, the counter 114 completes the count operation while the count of the counter is all "1's". Since a carry signal from the counter 114 remains "1", the J-K flip-flop 113 holds the state of a logical "1".

When the input signal changes from a logical "1" to a logical "0" as shown in FIG. 6B, the counter 114 starts to be decremented, as shown in FIG. 6I, from the "111" state. When the count of the counter 114 becomes "000", a borrow signal is produced as shown in FIG. 6H. When the borrow signal from the counter 114 is outputted, the output of the J-K flip-flop 113 changes from a logical "1" to a logical "0". At the same time, since the borrow signal is applied through the inverter 116 to a second 3-input AND circuit 111, the AND circuit 111 is disabled. As a result, as no count-down pulse is applied to the DOWN input terminal of the counter 114, the counter 114 completes a count operation.

In the following description noise resulting from chattering etc. is superposed on the input signal.

When noise resulting from chattering etc. is superposed on the input signal as shown in FIG. 7B, the input signal is delivered such that it is delayed an amount corresponding to the clock width of the sampling clock signal as shown in FIG. 7A. When the set output of the D-type flip-flop 108 is present, the first 3-input AND circuit 110 is enabled and a count-up pulse is applied to the counter 114. The counter 114 has its count incremented by one. When the reset output of the D-type flip-flop 108 goes to a logical "1", the second 3-input AND circuit 111 is enabled and a count-down pulse is applied to the counter 114 to cause the counter to be decremented by one. When the input signal is in a steady state, the counter 114 is incremented and when the count of the counter 114 is all "1's" (111 in this embodiment), the counter 114 delivers a carry signal.

Even if the input signal falls as indicated by the latter half of FIG. 7B, when noise is superposed thereon, an input signal latched by the D-type flip-flop 108 provides a waveform as shown in the latter half of FIG. 7C in which the input signal is delayed an amount corresponding to the width of one sampling clock signal. When a set output appears from the D-type flip-flop 108, a count-up pulse is applied to the counter 114 to cause the counter 114 to be incremented by one. When a reset output appears from the D-type flip-flop 108, the count-down pulse is applied to the counter 114 to cause the counter 114 to be decremented by one (refer to the latter half of FIG. 7F).

When thereafter the input signal is in the steady state, the counter 114 effects a decrement operation only. When the count of the counter 114 becomes all "0's" (000 in this embodiment), the counter 114 delivers a borrow signal.

In FIG. 3 the memory 117 uses the counter 114 such that the latter is time shared for the 64 input signals and stores the contents (3 bits) of the counter 114 corresponding to each input signal and the state of the output signal of the J-K flip-flop 113. The register file 125 interfaces with the computer and is refreshed each time data corresponding to one byte is shifted to the shift register 124 and data is read onto the computer for each byte unit.

The delay time $T_D$ (the time required for an output signal to change from a logical "0" to a logical "1" when the input signal changes from the logical "0" to a logical "1"—provided that no noise is superposed onto the input signal) of the digital input apparatus of this invention is defined as follows:

$$T_D = 2^n \times 1/f_{CLK} \times 4 \times N$$

where
n: the bit length of the counter 15
N: the number of input signals
$f_{CLK}$: the frequency of the reference clock signal In this equation, $4/f_{CLK}$ is the time required from the generation of the timing signals $\phi_0$ to $\phi_3$ until they are inputted for each one input signal. The resolution i.e. a variation of the delay time is $N \times 4/f_{CLK}$. If n and $f_{CLK}$ are set to suitable values taking into consideration the chattering of the input signal, i.e. the magnitude of of noise etc., it is possible to obtain an optimal delay time.

Figure 1:
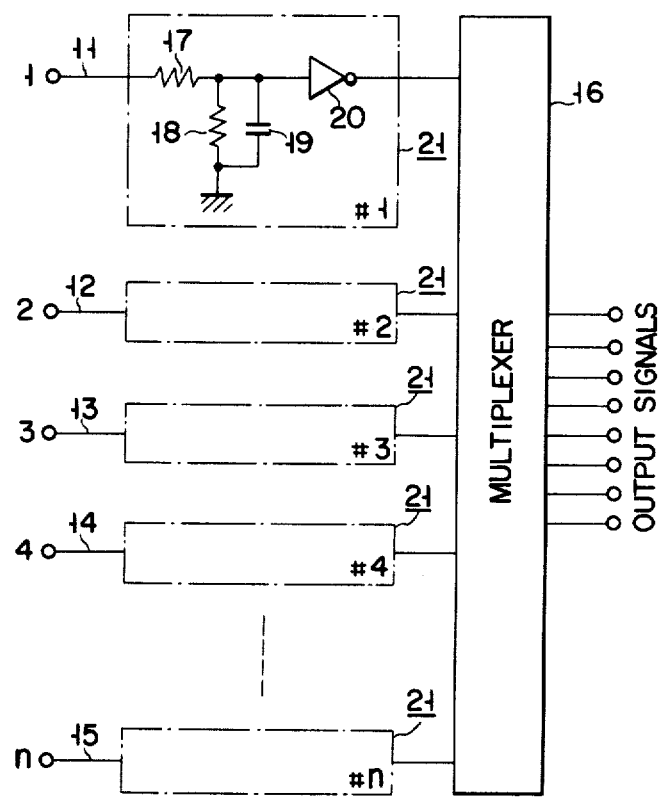
FIG. 1 is a circuit diagram showing one form of a conventional digital input apparatus.
Figure 2:
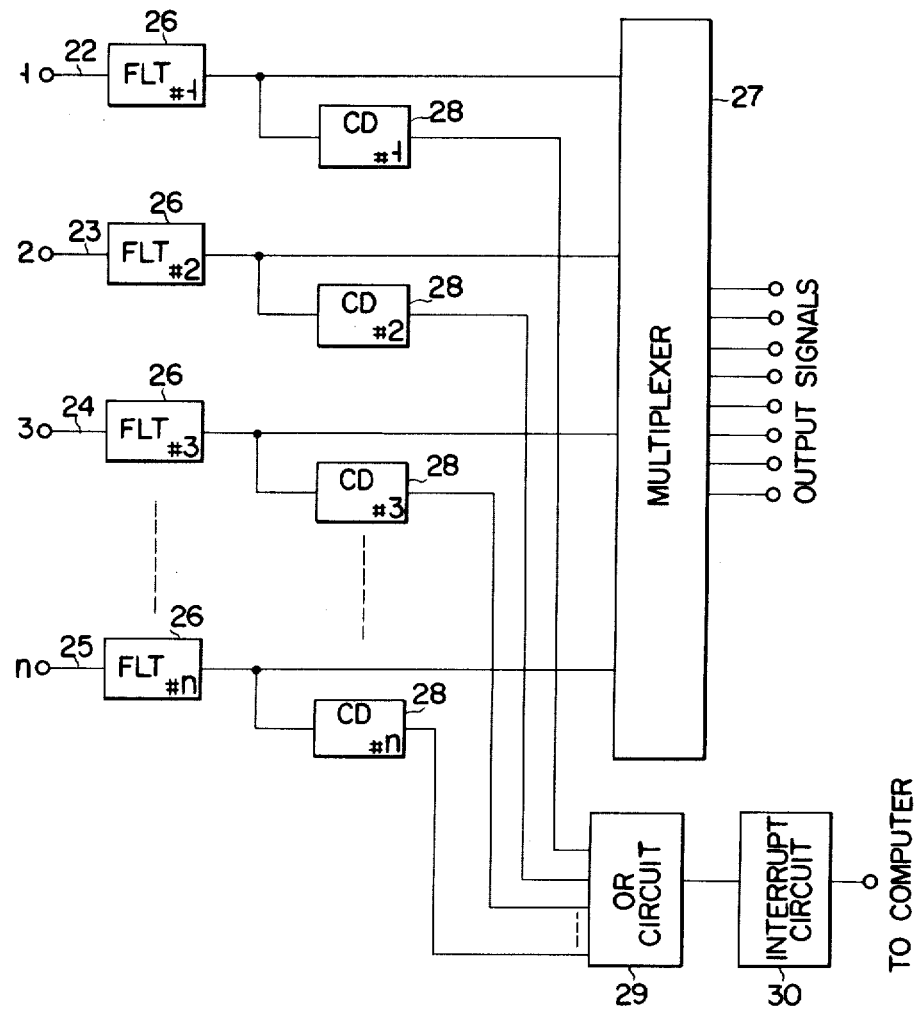
FIG. 2 is a circuit diagram showing another form of a conventional digital input apparatus.

FIG. 9 shows another embodiment of this invention which includes an interrupt circuit as does the prior art apparatus of FIG. 2. In FIG. 9 like reference numerals are employed to designate parts or elements corresponding to those shown in FIG. 3 and further explanation is omitted. The embodiment of FIG. 9 further includes a third 3-input AND circuit 131, a fourth 3-input AND circuit 132 and an interrupt circuit 133 in addition to the arrangement of FIG. 3. A reset output signal of the J-K flip-flop 113, a carry signal of the counter 114 and a trigger input signal from the AND circuit 112 are supplied to the third 3-input AND circuit 131.

Further, the set output signal of the J-K flip-flop 113, borrow signal from the counter 114 and trigger signal from the AND circuit 112 are inputted to a fourth 3-input AND circuit 132. The output terminals of the third and fourth 3-input AND circuits 131 and 132 are connected to the input terminal of an interrupt circuit 133. The interrupt circuit 133 is constructed of, for example, an OR circuit and an inverter and the output signals of the AND circuits 131 and 132 are applied thereby to a computer.

The operation of the FIG. 9 embodiment is described below.

The timing generator 107 generates signals as shown in FIGS. 4A to 4L as in the case of the embodiment of FIG. 3. Signal a, b, c, d, e, f of the timing generator 107 becomes a select signal of the multiplexer 105 and one of 64 input signals is selected. At the same time the signal a, b, c, d, e, f becomes an address signal of the memory 117 and a location of the memory 117 corresponding to the 64 input signals is designated.

While the signal a, b, c, d, e, f is being held, four timing signals $\phi_3$, $\phi_2$, $\phi_1$, $\phi_0$ are generated as shown in FIGS. 4I to 4L.

Upon generation of the timing signal $\phi_0$, the contents of the location of the memory 117 which is designated by the address signal a, b, c, d, e, f are preset to the counter 114 and the J-K flip-flop 113. At the same time, an input signal selected at the multiplexer 106 is latched to the D-type flip-flop 108.

Since upon generation of the timing signal $\phi_1$, a 3-input AND circuit 110 is enabled under the condition that the set output of the D-type flip-flop 108 is a logical "1" and that a carry signal from the counter 114 is not a logical "1", the count-up pulse is inputted to the up terminal of the counter 114 and the counter 114 starts its counting operation and is incremented bit by bit.

If the reset output of the D-type flip-flop 108 is a logical "1" and a borrow signal from the counter 114 is not a logical "1", a count-down pulse is inputted to the DOWN terminal of the counter 114 because the AND circuit 111 is enabled. The counter 114 starts its counting operation and is decremented bit by bit.

When the count of the counter 114 becomes all "1's" (111 in this embodiment), the counter 114 produces a carry signal. When the count of the counter become all "0's" (000 in this embodiment), the counter 114 produces a borrow signal.

Upon generation of the timing signal $\phi_1$, the J-K flip-flop 113 is set if the carry signal of the counter 114 is a logical "1" and reset if the borrow signal is a logical "1". If the carry and borrow signals are both a logical "0", the flip-flop 113 holds a value preset from the memory 117 thereto when the timing signal $\phi_0$ is generated.

Upon generation of the timing signal $\phi_2$, the count of the counter 114 and the content of the J-K flip-flop 113 are stored in the memory 117 and at the same time the content of the J-K flip-flop 113 is shifted one bit to a shift register 124.

When the operation based on the timing signals $\phi_0$ to $\phi_2$ is repeated eight times, 8-bit data is latched to the shift register 124 and if at this time the timing signal $\phi_3$ is produced, the 8-bit data from the shift register 124 is latched to a register in the register file 125 which is determined by the select signal a, b, c.

The number of bytes designated by the byte select signal is outputted as an output of the register file 125 to a computer.

A status variation detection function will now be described.

After data from the memory 117 is preset to the counter 114 and J-K flip-flop 113, an input signal changed upon receipt of the timing signal is loaded into the counter 114. If at this time the carry signal from the counter 114 is a logical "1" and the reset output of the J-K flip-flop 113 is a logical "1", then the input signal changed from logical "0" to a logical "1".

That is, as shown in FIG. 3, the up-down operation of the counter 114 and operation of J-K flip-flop 113 are effected by the same timing signal. Now suppose that the previous value of the input signal is "0", the count of the counter 114 is "110" and that a new input value is "1". Then, the value of the counter 114 becomes "111" upon generation of the timing signal $\phi_1$ to produce a carry signal. At the same time, a clock signal is supplied to the J-K flip-flop 113. Since at this time the carry signal from the counter 114 is being outputted, if the count value "111" is loaded at the next cycle from the memory 117, the J-K flip-flop 113 is set by the timing signal $\phi_1$.

The third 3-input AND circuit 131 performs an AND operation and a status detection pulse detecting a rise of the input signal is delivered from the AND circuit 131. An interrupt signal is produced from the interrupt circuit 133 upon receipt of the status detection pulse from the AND circuit 131.

When the decrement operation of the counter 114 is completed and the count of the counter 114 becomes all "0's", the borrow signal becomes a logical "1". If at this time the set output of the J-K flip-flop 113 is a logical "1", then the input signal changed from a logical "1" to a logical "0".

That is, when the value of the counter 114 is "001" and a new input value is "0", the value of the counter 114 becomes "000" upon generation of the timing signal $\phi_1$ and a borrow signal is outputted. At the same time a clock signal is supplied to the J-K flip-flop 113. Since at this time a borrow signal from the counter 114 is being outputted, when at the next cycle the counter value "000" is loaded from the memory 117, the J-K flip-flop is reset by the timing signal $\phi_1$.

The 3-input AND circuit 132 performs an AND operation and a status detection pulse detecting a fall of the input signal is outputted from the 3-input AND circuit 132.

An interrupt signal is produced from the interrupt circuit 133 by the status detection pulse from the 3-input AND circuit 132.

When the count of the counter 114 is all "1's" or "0's", a counting operation is inhibited. At this time the count is held and a carry signal or a borrow signal continues to be outputted. The interrupt signal is applied to, for example, a computer which in turn detects that the input signal changed and reads out the input signal.

The digital input apparatus of this invention is suitable as an input apparatus for inputting a detection signal from one or more sensors to a digital signal processor such as a computer.

What is claimed is:

1. A digital input apparatus comprising
   multiplexer means adapted to receive a plurality of input signals and select a desired input signal for outputting;
   first latch means connected to said multiplexer means to latch the output signal selected by said multiplexer means;
   counter means for effecting a count operation from an output signal from said first latch means;
   second latch means connected to said counter means to latch an output signal from said counter means;
   gate means connected between the first latch means and said counter means to control a signal inputted to said counter means by the output of said counter means;
   memory means connected to said counter means and to an output signal from said second latch means for storing a count of said counter means and the output signal from said second latch means; and
   timing signal generating means for supplying timing signals to the multiplexer means, said counter means and said memory means and for supplying an address control signal to said multiplexer means and said memory means.

2. A digital input apparatus according to claim 1, further including register means for converting the output signal from said second latch means from a serial output signal to a parallel output signal.

3. A digital input apparatus according to claim 2, further including interrupt means for producing an interrupt signal from the output signal from said second latch means.

4. A digital input apparatus according to claim 2, in which said register means is a shift register.

5. A digital input apparatus according to claim 1, further including interrupt means for producing an interrupt signal from the output signal from said second latch means.

6. A digital input apparatus according to claim 5 or 3, in which said interrupt means comprises a gate for detecting a status change of said desired input signal, and an interrupt circuit for producing an interrupt signal from the output of said gate.

7. A digital input apparatus according to claims 2, 5 or 3 in which said first latch means is a D-type flip-flop.

8. A digital input apparatus according to claim 2 in which said second latch means is a J-K flip-flop.

9. A digital input apparatus according to claims 1, 2, 5 or 3, in which said gate means comprises an inverter for inverting said output signal of said counter means, and an AND gate adapted to receive an output signal of said inverter, said output signal of said first latch means and a logical product signal of said timing signal and clock signal.

10. A digital input apparatus according to claim 1, 2, 5 or 3 in which said counter means is incremented or decremented by a count-up pulse or a count-down pulse supplied to said gate means and produces a carry signal when the count of the counter means becomes all logical "1's", and a borrow signal when the count becomes a logical "0".

11. A digital input apparatus according to claim 1, 2, 5 or 3, in which said counter means permits a predetermined count which corresponds to each input signal to be preset.

* * * * *